US012754580B2

(12) United States Patent
Ravezzi

(10) Patent No.: US 12,754,580 B2
(45) Date of Patent: Oct. 6, 2026

(54) FAST SETTLING VOLTAGE REGULATOR CIRCUITRY WITH POLE FREQUENCY TRACKING

(71) Applicant: Advanced Micro Devices, Inc., Santa Clara, CA (US)

(72) Inventor: Luca Ravezzi, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 274 days.

(21) Appl. No.: 18/745,991

(22) Filed: Jun. 17, 2024

(65) Prior Publication Data

US 2025/0383680 A1 Dec. 18, 2025

(51) Int. Cl.
*G05F 1/575* (2006.01)
*G05F 3/26* (2006.01)
*H03F 3/45* (2006.01)

(52) U.S. Cl.
CPC .............. *G05F 1/575* (2013.01); *G05F 3/262* (2013.01); *H03F 3/45183* (2013.01); *H03F 3/45273* (2013.01); *H03F 2200/261* (2013.01)

(58) Field of Classification Search
CPC ...... G05F 1/575; G05F 3/262; H03F 3/45183; H03F 3/45273; H03F 2200/261
See application file for complete search history.

(56) References Cited

U.S. PATENT DOCUMENTS 6,486,740 B1 * 11/2002 Baldwin .................. H03F 1/14 330/294
6,822,514 B1 * 11/2004 Aude .................. H03F 3/45192 330/292
2023/0152831 A1 * 5/2023 Chang .................. G05F 1/461 327/540
2023/0208374 A1 * 6/2023 Cascio .................. H03F 3/193 330/252

* cited by examiner

*Primary Examiner* — Rafael O De Leon Domenech
(74) *Attorney, Agent, or Firm* — Patterson + Sheridan, LLP

(57) ABSTRACT

An integrated circuit system includes voltage regulator circuitry that is coupled to and drives an integrated circuit device. The voltage regulator circuitry includes source follower circuitry, trans-impedance amplifier circuitry, and tracking circuitry. The source follower circuitry receives a first signal and generates a second signal by applying a first gain to the first signal. The trans-impedance amplifier circuitry receives the second signal from the source follower circuitry and outputs a third signal based on the second signal. The tracking circuitry receives the third signal from the trans-impedance amplifier circuitry and an output signal of the voltage regulator circuitry, and tracks a load current of the output signal using the third signal.

20 Claims, 5 Drawing Sheets

FAST SETTLING VOLTAGE REGULATOR CIRCUITRY WITH POLE FREQUENCY TRACKING

TECHNICAL FIELD

Examples of the present disclosure generally relates to voltage regulator circuitry that has a fast settling time and an increase in the operating bandwidth based on pole frequency tracking.

BACKGROUND

Power supply devices employ voltage regulators (e.g., voltage regulator circuitry) to provide a constant direct current (DC) output voltage regardless of changes in load current or input voltage. A voltage regulator may be a linear voltage regulator. An example of a linear voltage regulator is a low-dropout (LDO) voltage regulator. An LDO voltage regulator can be used to generate an internal supply voltage for an integrated circuit (IC) device. An LDO voltage regulator can be based on flipped source follower circuitry.

A fast settling voltage regulator is used for power management in an IC device (e.g., a System-on-Chip and memory IC device). Such IC devices quickly switch from having no activity to operating at full activity. In support of such IC devices, a voltage regulator must reacts to changes from no load current to 100 percent load current within a very short period of time. Voltage regulators based on flipped source follower circuitry often utilize P-channel metal oxide semiconductor (PMOS) transistors, internal compensation techniques, and a small load capacitance to provide a stable output voltage and a fast settling time. However, such voltage regulators suffer from poor Power Supply Rejection Ratio (PSRR) and limited range in the load current.

SUMMARY

In one example, voltage regulator circuitry includes source follower circuitry, trans-impedance amplifier circuitry, and tracking circuitry. The source follower circuitry receives a first signal and generates a second signal by applying a first gain to the first signal. The trans-impedance amplifier circuitry receives the second signal from the source follower circuitry and outputs a third signal based on the second signal. The tracking circuitry receives the third signal from the trans-impedance amplifier circuitry and an output signal of the voltage regulator circuitry, and tracks a load current of the output signal using the third signal.

In one example, an integrated circuit (IC) system includes an IC device and voltage regulator circuitry. The voltage regulator circuitry is coupled to the IC device and outputs an output signal to the IC device. The voltage regulator circuitry includes source follower circuitry, trans-impedance amplifier circuitry, and tracking circuitry. The source follower circuitry receives a first signal and generates a second signal by applying a first gain to the first signal. The trans-impedance amplifier circuitry receives the second signal from the source follower circuitry and outputs a third signal based on the second signal. The tracking circuitry receives the third signal from the trans-impedance amplifier circuitry and the output signal, and tracks a load current of the output signal using the third signal.

In one example, a method includes receiving, via source follower circuitry of voltage regulator circuitry, a first signal and generating a second signal by applying a first gain to the first signal. Further, the method includes generating, via trans-impedance amplifier circuitry of the voltage regulator circuitry, a third signal based on the second signal. The method further includes tracking, via tracking circuitry of the voltage regulator circuitry, a load current of an output signal of the voltage regulator circuitry using the third signal.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
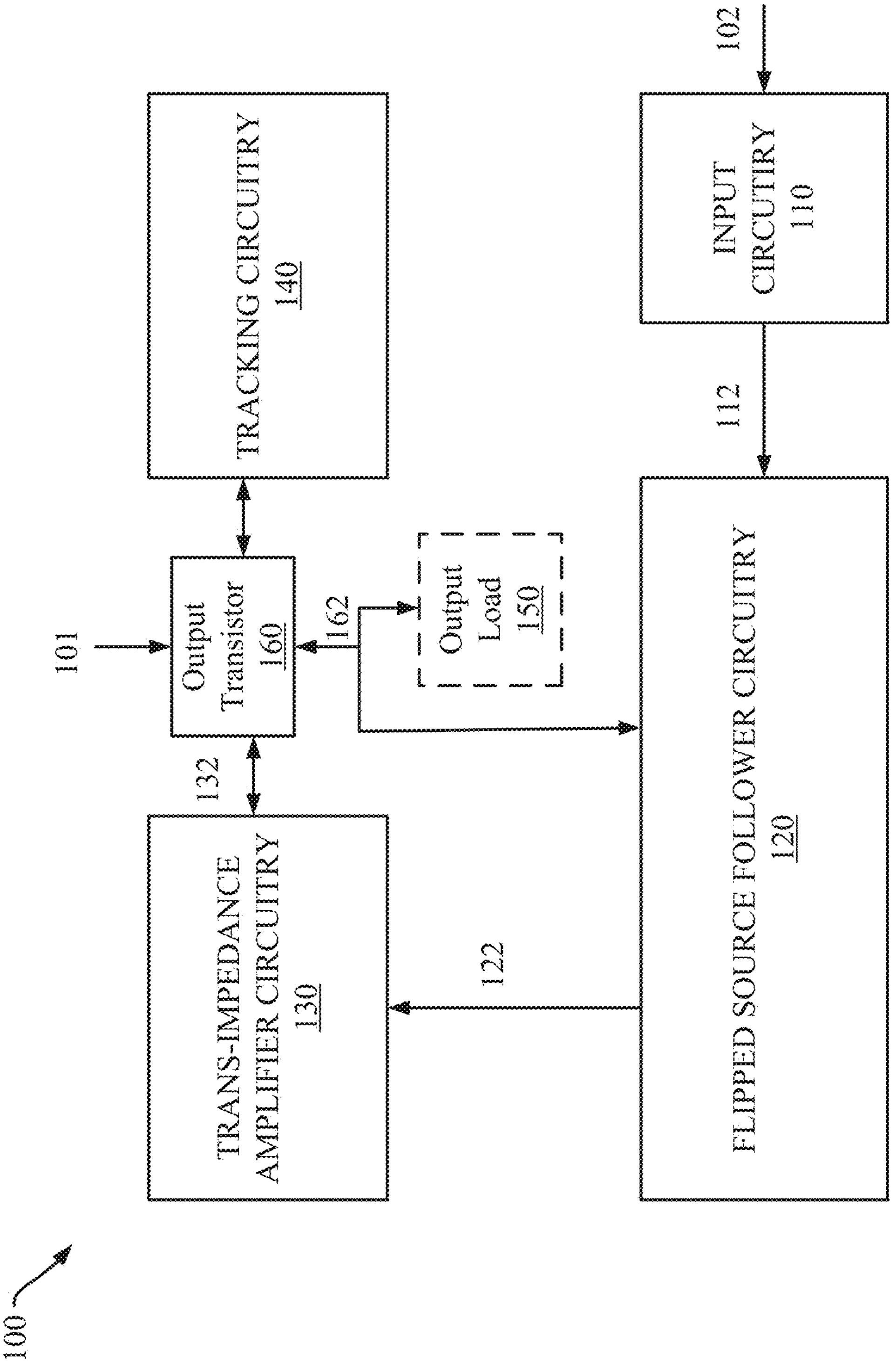
FIG. 1 illustrates a schematic block diagram of an integrated circuit system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Integrated circuit (IC) devices are driven by power supply circuitries. A power supply circuitry provides a constant direct current (DC) output voltage (e.g., output voltage signal). In one example, power supply circuitry includes voltage regulator circuitry that receives an input voltage signal (e.g., an unregulated supply signal) and outputs a constant DC output voltage. In one or more examples, voltage regulators generate supply voltages for electronic devices. In one example, a voltage regulator is used to generate an internal supply voltage for an IC device. Voltage regulators may be included within or external to IC devices. A voltage regulator circuitry provides a constant DC output voltage regardless of changes in load current or input voltage. A voltage regulator may be a linear voltage regulator, such as a low-dropout (LDO) voltage regulator. An LDO voltage regulator can be based on flipped source follower circuitry. LDO voltage regulators based on flipped source followers are known to have wide bandwidth and a fast settling time.

IC devices include power management circuitries. A power management circuitry includes an LDO voltage regulator. In an IC device that operates in a burst mode (e.g., a System-on-Chip (SoC) and memory IC device), the LDO voltage regulator must support burst mode operations by providing a stable regulated supply that can settle in a very short time. In fact, when operating in a burst mode, an IC device quickly switches from having little to no activity (e.g., a low output load current) to operating at fully activity (e.g., a high output load current). To support operating in a burst mode, an LDO voltage regulator supports changes of up to 100× the load current within a short period of time (e.g., less than about 1 nano-second).

In the following, improved voltage regulator circuitry architecture is described. The voltage regulator circuitry as described in the following includes a flipped source follower circuitry, and includes N-channel MOS (NMOS) transistors, trans-impedance amplifier circuitry, and tracking circuitry. The use of NMOS transistor as power transistor provides a better PSRR. The trans-impedance amplifier circuitry, and tracking circuitry boasts the bandwidth of the voltage regulator circuitry and provides a fast settling time (e.g. less than 1 nano-second). As is described in the following, the non-dominant pole frequencies in the feedback loop of the voltage regulator circuitry are moved to a high frequency via the trans-impedance amplifier circuitry, increasing the bandwidth of the voltage regulator circuitry. The PZ tracking circuitry cancels the first non-dominant pole frequency in the voltage regulator circuitry, further increasing the regulator bandwidth while maintaining a stable output DC voltage signal over a wide range of load currents.

FIG. 1 illustrates a schematic block diagram of a voltage regulator circuitry 100, according to one or more examples. In one example, the voltage regulator circuitry 100 is LDO voltage regulator circuitry. In other examples, the voltage regulator circuitry 100 is another type of voltage regulator circuitry. The voltage regulator circuitry 100 includes input circuitry 110, flipped source follower circuitry 120, trans-impedance amplifier circuitry 130, tracking circuitry 140, and output transistor 160. In one example, the input circuitry 110 receives a voltage signal (e.g., reference voltage) 102. The voltage signal 102 may be referred to as a reference voltage signal. The output transistor 160 receives the supply voltage signal 101. In one example, the supply voltage signal 101 is unregulated. In one example, the input circuitry 110 outputs the signal 112 based on the voltage signal 102.

The flipped source follower circuitry 120 is coupled to the output of the input circuitry 110. The flipped source follower circuitry 120 receives signal 112 from the input circuitry 110 and generates the signal 122 from the signal 112. The flipped source follower circuitry 120 is further coupled to the output transistor 160. The flipped source follower circuitry 120 receives the signal 162 from the output transistor 160. The signal 122 is further generated based on the signal 162.

The trans-impedance amplifier circuitry 130 is coupled to the output of the flipped source follower circuitry 120. The trans-impedance amplifier circuitry 130 receives the signal 122 from the flipped source follower circuitry 120. In one example, the signal 132 is generated from the signal 122, and based on the gain of the trans-impedance amplifier circuitry 130.

The output transistor 160 receives the signal 132 from the trans-impedance amplifier circuitry 130, and the supply voltage signal 101, and outputs the signal 162 onto the output load 150 based on the signal 132 and the supply voltage signal 101. The purpose of the regulator is to have signal 162 as independent as possible from the supply voltage signal 101. The load current Iload corresponds to the output load 150 driven by the voltage regulator circuitry 100.

The first non-dominant pole is located on signal (e.g., output voltage signal) 162 that has a frequency that moves with load current Iload of the output load 150. The tracking circuitry 140 adds a zero in the system that tightly tracks the frequency of the first non-dominant pole at the signal 162. As a result, the zero added by the tracking circuitry 140 cancels the first non-dominant pole on the signal 162 for wide range of load currents of the output load 150.

Figure 2:
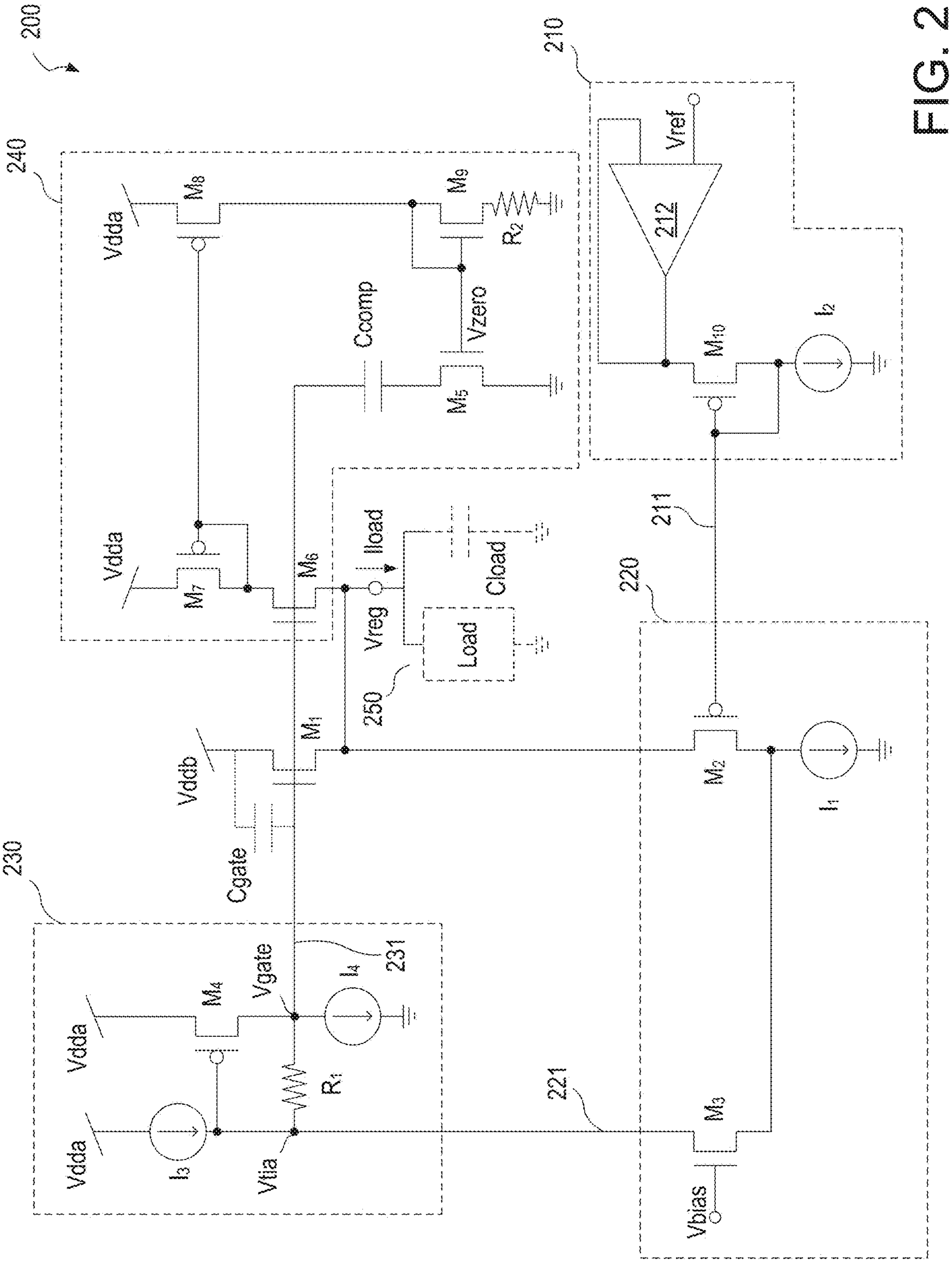
FIG. 2 illustrates a schematic block diagram of the proposed voltage regulator circuitry.

FIG. 2 illustrates a schematic block diagram of voltage regulator circuitry 200, according to one or more examples. The voltage regulator circuitry 200 is configured similar to the voltage regulator circuitry 100 of FIG. 1. The voltage regulator circuitry 100 includes input circuitry 210, source follower circuitry 220, trans-impedance amplifier circuitry 230, tracking circuitry 240, and output transistor $M_1$. The input circuitry 210 is configured similar to that of the input circuitry 110 of FIG. 1. The source follower circuitry 220 is configured similar to that of the source follower circuitry 120 of FIG. 1. The trans-impedance amplifier circuitry 230 is configured similar to the trans-impedance amplifier circuitry 130 of FIG. 1. The tracking circuitry 240 is configured similar to the tracking circuitry 140 of FIG. 1. Further, the output transistor $M_1$ is configured similar to the output transistor 160 of FIG. 1.

The input circuitry 210 receives a reference voltage signal Vref, and generates the signal 211 from the reference voltage signal. In one example, the input circuitry 210 is reference voltage circuitry. In such an example, the signal 211 is a reference voltage signal. The input circuitry 210 includes operational amplifier (op-amp) 212, transistor $M_{10}$, and current source $I_2$. The op-amp 212 receives the reference voltage signal Vref. The transistor $M_{10}$ is a PMOS transistor. The transistor $M_{10}$ is coupled to the output of the op-amp 212. The current sink 12 is coupled between the transistor $M_{10}$ and a ground (or another constant voltage) voltage node. The op-amp 212 is in a follower configuration with a flipped PMOS current mirror (e.g., the transistor $M_{10}$ and the current source $I_2$). In other examples, the input circuitry 210 is not limited to the circuit configuration as illustrated in FIG. 2, and may include other circuit elements additionally to and/or alternately to the circuit elements illustrated in FIG. 2.

The input of the source follower circuitry 220 is coupled to the output of the input circuitry 210, and receives the signal 211 from the input circuitry 210. The source follower circuitry 220 may be flipped source follower circuitry. In one example, the source follower circuitry 220 is a voltage buffer that can be used as a front-end buffer. In one or more examples, the source follower circuitry 220 is a flipped source follower circuitry that has a low output impedance. A flipped source follower circuitry may function as a level shifter, and has a gain that is independent of the output load current of the voltage regulator circuitry 200. In one example, the gain of the source follower circuitry 220 is unity. In other examples, the gain of the source follower circuitry 220 is greater than or less than unity.

The source follower circuitry 220 includes transistor $M_2$, transistor $M_3$, and current source $I_1$. The transistor $M_2$ is a PMOS transistor, and the transistor $M_3$ is a NMOS transistor.

In other examples, the flipped source follower circuitry 220 may have a configuration different from that illustrated in FIG. 2.

The gate node of the transistor $M_2$ is coupled to the output of the input circuitry 210. The drain node of the transistor $M_2$ is coupled to a node that is coupled to the current source $I_1$ and a source of the transistor $M_3$. The source of the transistor $M_2$ is coupled to the node Vreg. The current source $I_1$ is further coupled to a ground voltage node. The gate node of the transistor $M_3$ is coupled a node that receives Vbias. A drain of the transistor $M_3$ is coupled to the trans-impedance amplifier circuitry 230.

The source follower circuitry 220 applies a gain to the signal 211 to generate the signal 221. During operation, a variation in the voltage of the voltage signal Vref is detected (e.g., sensed) and amplified. Moreover, during operation, a variation in the voltage of the output voltage Vreg is also sensed by M2 and amplified at the signal (e.g., voltage signal) 221. The gain applied to the signals 211 and Vreg may be an inverted gain or a non-inverted gain. Accordingly, the source follower circuitry 220 may be an inverting source follower circuitry or a non-inverting source follower circuitry.

The trans-impedance amplifier circuitry 230 is coupled to the output of the source follower circuitry 220. The trans-impedance amplifier circuitry 230 includes nodes Vtia (e.g., an input node) and Vgate (e.g., an output node). As the source follower circuitry 220 may be considered as an input stage of a non-inverting amplifier in a folded-common gate configuration, the trans-impedance amplifier circuitry 230 is used to provide (e.g., generate) phase inversion to establish negative feedback. The trans-impedance amplifier circuitry 230 is a gain stage that applies a gain to the signal 221. The trans-impedance amplifier circuitry 230 outputs a signal 231 based on the signal 221. In one example, the signal 231 is generated from the signal 221, and based on the gain of the trans-impedance amplifier circuitry 230. In one or more examples, the trans-impedance amplifier circuitry 230 is within the feedback loop of the source follower circuitry 120. The trans-impedance amplifier circuitry 230 increases the operating bandwidth of the voltage regulator circuitry 100.

In one or more examples, the trans-impedance amplifier circuitry 230 pushes (e.g., moves, adjusts, increases, or sets) the frequency of the pole of the signal 221 at node Vtia to a high frequency. Further, the trans-impedance amplifier circuitry 230 pushes (e.g., moves, adjusts, increases, or sets) the frequency of the pole of the signal 231 at the node Vgate to a high frequency. Increasing the pole frequencies as described above, increases the operating bandwidth of the voltage regulator circuitry 200, improving the performance of the voltage regulator circuitry 200.

FIG. 2 illustrates one example configuration of trans-impedance amplifier circuitry. In other examples, other configurations of trans-impedance circuitries may be used. For example, the trans-impedance circuitry can be constructed in different ways that are able to push the frequency of the pole of the signal 231 at node Vtia to a high frequency, and push the frequency of the pole of the signal 231 at the node Vgate to a high frequency. In the example of FIG. 2, the trans-impedance amplifier circuitry 230 includes transistor $M_4$, current sources $I_3$ and $I_4$, and resistor $R_1$. The current source $I_3$ is connected to a node that receives the voltage Vdda, a gate of the transistor $M_4$, and node Vtia. The transistor $M_4$ is a PMOS transistor. The gate of the transistor $M_4$ is coupled to the output of the current source Is and the node Vtia. Further, the drain of the transistor $M_4$ is coupled to the node Vgate. The source of the transistor $M_4$ is coupled to a node that receives the voltage Vdda. The resistor $R_1$ is coupled between the nodes Vtia and Vgate. The current source $I_4$ is coupled between the node Vgate and a node that receives a ground voltage.

In the example of FIG. 2, the trans-impedance amplifier circuitry 230 applies a gain to the signal 221 to generate the signal 231 so that the total voltage gain from Vreg to Vgate is given by the transconductance of transistor $M_2$ ($gm_{M_2}$) times the resistance of resistor $R_1$ ($R_{R_1}$), or $gm_{M_2} \times R_{R_1}$. The input and output resistance is based on the transconductance of transistor $M_4$ ($gm_{M_4}$). For example, the input and output resistance is $1/(gm_{M_4})$.

In one example, the output of the trans-impedance amplifier circuitry 230 (e.g., the node Vgate) is coupled to the gate of the transistor $M_1$. The transistor $M_1$ is the output transistor of the voltage regulator circuitry 200. The transistor $M_1$ is an NMOS. The drain of the transistor $M_1$ is coupled to a node that receives the voltage signal Vddb. The voltage of the voltage signal Vddb may be greater than or less than the voltage of the voltage signal Vdda. The source of the transistor $M_1$ is coupled to the source of the transistor $M_2$ and to the output node Vreg of the voltage regulator circuitry 200.

The dominant pole of the regulator is on the node that outputs the signal 231. The total capacitance of the dominant pole on the node that outputs signal 231 is given by the parasitic capacitance Cgate of transistor $M_1$ plus capacitance Ccomp in the tracking circuitry 240. The parasitic capacitance Cgate limits the bandwidth of the regulator and degrades the regulator PSRR. The trans-impedance amplifier circuitry 230 reduces the equivalent resistance of the node that outputs signal 231 and hence pushes the frequency of the pole on the node to high frequency. As a result, the bandwidth of the regulator is increased and the effect of Cgate in degrading the regulator PSRR is reduced.

The output node (e.g., the node Vreg) of the voltage regulator circuitry 200 is coupled to output load 250. The output load includes a load capacitance Cload.

The pole on the output signal Vreg, driving the output load 250, is the first-non dominant pole of the regulator feedback loop. As the load current Iload of the output load 250 varies, the pole frequency of output voltage signal Vreg moves (e.g., changes), limiting the maximum bandwidth of the voltage regulator circuitry 200. In one example, the pole frequency of the output signal Vreg may be moved by about one or two decades. The tracking circuitry 240 tracks the load current Iload to mitigate (e.g., cancel or minimize) the pole on the output signal Vreg.

The tracking circuitry 240 may be referred to as pole zero (PZ) tracking circuitry. The tracking circuitry 240 includes transistors $M_5$, $M_6$, $M_7$, $M_8$ and $M_9$, capacitor Ccomp, and resistor $R_2$. The transistors $M_5$, $M_6$, and $M_9$ are NMOS transistors. The transistors $M_7$ and $M_8$ are PMOS transistors.

The gate of the transistor $M_6$ is coupled to the gate of the transistor $M_1$, and to the node Vgate (e.g., the output of the trans-impedance amplifier circuitry 230). The source of the transistor $M_6$ is coupled to the output node of the voltage regulator circuitry 200. The drain of the transistor $M_6$ is coupled to the drain and gate of the transistor $M_7$. The source of the transistor $M_7$ is coupled to a node that receives the voltage Vdda, and the gate of the transistor $M_7$ is coupled to its drain and to the gate of the transistor $M_8$. The source of the transistor $M_8$ is coupled to a node that receives the voltage Vdda, and a drain of the transistor $M_8$ is coupled to the drain of the transistor $M_9$. The source of the transistor $M_9$ is coupled to the resistor $R_2$, which is further coupled to a node that receives a ground voltage. The gate and drain of the transistor Mg are couple together, such that the transistor $M_9$ is in a diode connected configuration. Further, the gate of the transistor $M_9$ is coupled to the gate of the transistor $M_5$. The source of the transistor $M_5$ is coupled to a node that receives a ground voltage and a drain of the transistor $M_5$ is coupled to the capacitor Ccomp. The capacitor Ccomp is further coupled to the gate of the transistors $M_1$ and $M_6$, and the node Vgate (e.g., the node that outputs signal 231 in FIG. 2).

While FIG. 2 illustrates an example configuration of tracking circuitry 240, in other examples, different configurations of tracking circuitry may be used to mitigate a pole on signal Vreg.

In one example, the capacitor Ccomp is a compensation capacitance on node Vgate for the regulator feedback loop. The transistor $M_5$ is coupled in series with the capacitor Ccomp. The transistor $M_5$ functions in the triode region and adds a zero in the feedback loop that tracks and mitigates (e.g., cancels or minimizes) the pole on the output signal at node Vreg. The transistor $M_6$ is 1/N the size of the transistor $M_1$, and functions in the same operating point. The transistor $M_6$ is a scaled version of the transistor $M_1$ (e.g., the output transistor). The current through the transistor $M_6$ is 1/N the current on $M_1$. Therefore the current on $M_6$ linearly tracks the load current Iload. The current on $M_6$ is mirrored by the transistors $M_7$ and $M_8$, and drives the transistor $M_9$, which is configured as a diode connected transistor, and the resistor $R_2$ that is connected in series with the transistor $M_9$, to generate the voltage Vzero. The voltage Vzero linearly controls the on resistance of the transistor $M_5$ to create a "zero" to cancel the first non-dominant pole at the output signal node Vreg. In one example, the resistance value of the transistor $M_5$ is a linear function of the load current. The frequency location of the "zero" is a function of the load current Iload, and may span more than a decade in frequency range. In one example when the load current Iload is low, the impedance of the output load is high and the frequency of the first non-dominant pole on node Vreg is low. Since load current Iload is low, current on transistor $M_6$ is also low, and Vzero on transistor $M_5$ is low, increasing the resistance of $M_5$. Accordingly, the "zero" location is pushed to low frequencies and cancels the first non-dominant pole by tracking the first non-dominant pole to lower frequencies. In one or more examples, the pole frequency of the signal 231 is adjusted based on an output resistance the trans-impedance amplifier circuitry 230. For example, the pole frequency of the signal 231 is increased based on a low output resistance of the trans-impedance amplifier circuitry 230. The output resistance of the trans-impedance amplifier circuitry 230 corresponds to a resistance of the load 250.

In one example when the load current Iload is high, the impedance of the output load is low, and the frequency of the first non-dominant pole on node Vreg is high. As the load current Iload is high, current on transistor $M_6$ is also high and Vzero on transistor M5 is high, decreasing the resistance of M5. Accordingly, the "zero" location is pushed to high frequencies and the first non-dominant pole is canceled by tracking the first non-dominant pole to higher frequencies. The resistance of the transistor $M_5$ is programmable.

In one example, the capacitance value of Cload is 350 pF, and the capacitance value of Ccomp is 12 pF. The load current Iload increases from 1.7 mA to 170 mA in about 150 ps. The output signal at node Vreg settles in less than about 1 ns when using the voltage regulator circuitry 100 or 200.

The voltage regulator circuitry 100 of FIG. 1 and the voltage regulator circuitry 200 of FIG. 2 has an increased bandwidth (e.g., greater than about 1 GHZ) with minimum current for core operations as compared to designs that do not include trans-impedance amplifier circuitry and tracking circuitry. Further, the voltage regulator circuitry 100 of FIG. 1 and the voltage regulator circuitry 200 of FIG. 2 have an improved PSRR without using large compensation capacitance as compared to designs that do not use an NMOS based architecture as is described above. The voltage regulator circuitry 100 of FIG. 1 and the voltage regulator circuitry 200 of FIG. 2 provide a fast settling time and an improved PSRR, while using a compact circuit area and minimum core current.

Figure 3:
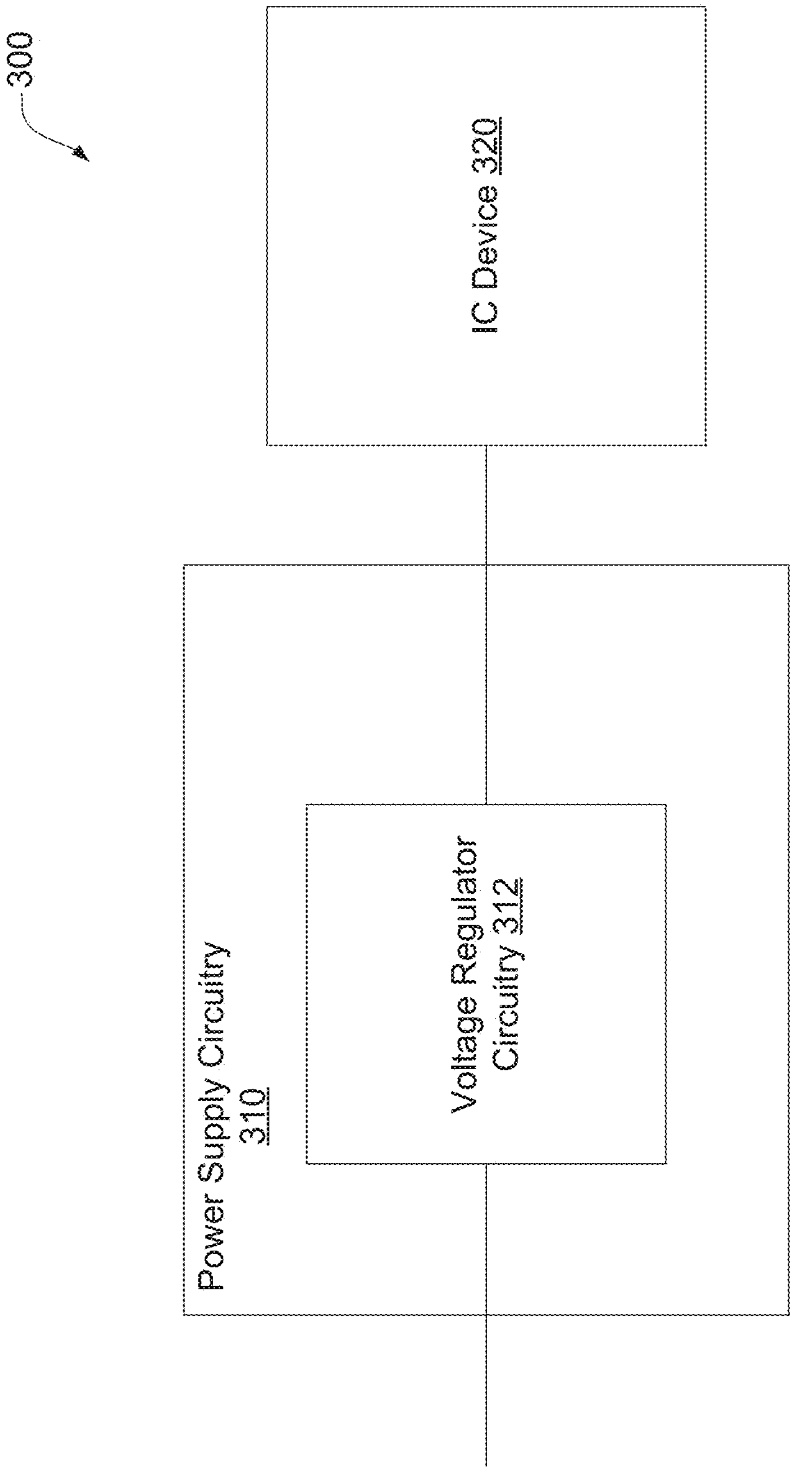
FIG. 3 illustrates a block diagram of voltage regulator circuitry.

FIG. 3 illustrates an integrated circuit (IC) system 300, according to one or more examples. The IC system 300 includes power supply circuitry 310 and IC device 320. The power supply circuitry 310 drives (e.g., outputs) a power supply signal (e.g., a voltage signal) to the IC device 320. The IC device 320 is the output load of the power supply circuitry 310. The power supply circuitry 310 includes a voltage regulator circuitry 312. The voltage regulator circuitry 312 is configured similar to the voltage regulator circuitry 100 of FIG. 1 or the voltage regulator circuitry 200 of FIG. 2. In one example, the voltage regulator circuitry 200 receives a reference voltage and outputs an output voltage signal, generated as described above, to the IC device 320. The IC device 320 is the output load of the voltage regulator circuitry 312.

The IC device 320 is an electronic device driven by the power supply circuitry 310. The IC device 320 may be a processing device, a memory device, or a communications device, among others. The IC device 320 and the power supply circuitry 310 may be coupled (e.g., mounted) to a common substrate, forming a packaged device. In another example, the IC device 320 and the power supply circuitry 310 are coupled to different substrates. In one example, at least a part of the IC device 320 and at least part of the power supply circuitry 310 are included in a common IC chip (or die). In other examples, the IC device 320 and the power supply circuitry 310 are included within separate IC chips. Further, while FIG. 3 illustrates a single power supply circuitry 310 driving the IC device 320, in other examples multiple power supply circuitries 310, each including a respective voltage regulator circuitry 312, are coupled to and drive the IC device 320. In one or more examples, a single power supply circuitry 310 drives multiple IC devices 320.

Figure 4:
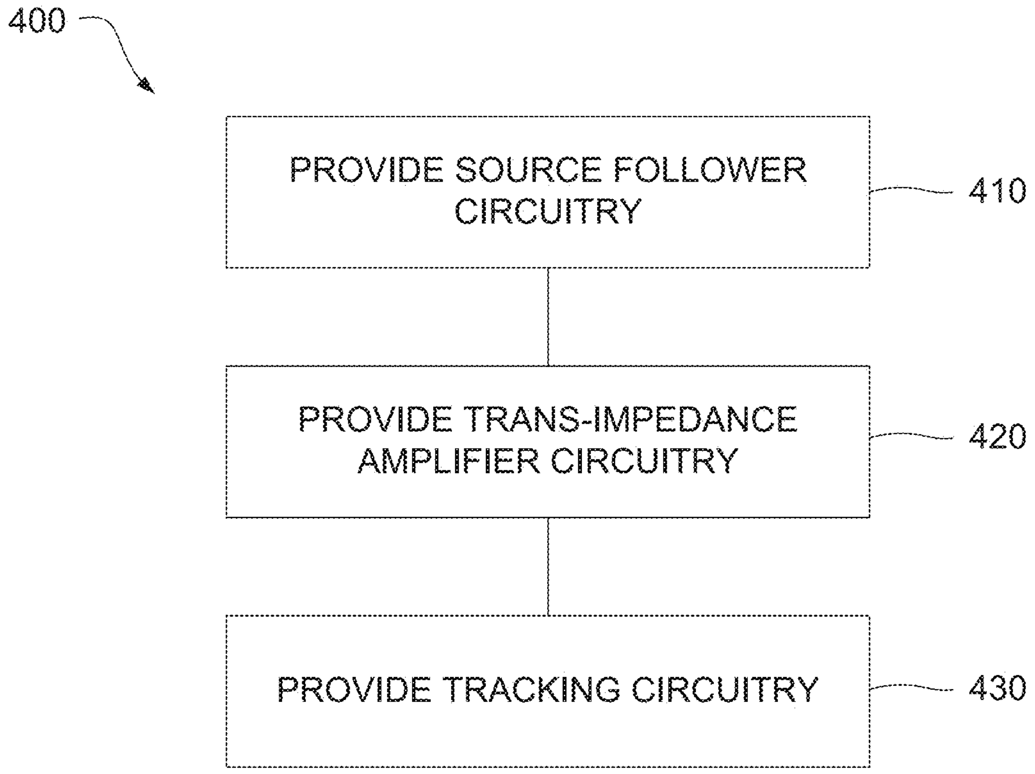
FIG. 4 illustrates a flowchart of a method of providing voltage regulator circuitry.

FIG. 4 illustrates a method of providing voltage regulator circuitry, e.g., the voltage regulator circuitry 100 of FIG. 1 or the voltage regulator circuitry 200 of FIG. 2, according to one or more examples. At 410 of the method 400, a source follower circuitry that receives a first signal (e.g., signal 111 of FIG. 1 or 211 of FIG. 2) and generates a second signal (e.g., the signal 121 of FIG. 1 or 221 of FIG. 2) by applying a first gain to the first signal is provided. The source follower circuitry is one of the flipped source follower circuitry 120 of FIG. 1 or the source follower circuitry 220 of FIG. 2. In one example, providing the source follower circuitry includes coupling the source follower circuitry to the output of input circuitry of the voltage regulator circuitry. At 420 of the method 400, a trans-impedance amplifier circuitry that receives the second signal from the source follower circuitry and outputs a third signal (e.g., the signal 131 of FIG. 1 or 231 of FIG. 2) based on the second signal is provided. The trans-impedance amplifier circuitry is one of the trans-impedance amplifier circuitry 130 of FIG. 1, the trans-impedance amplifier circuitry 230 of FIG. 2, or a trans-impedance amplifier circuitry having a different configuration and that is able to perform the functions as described above with regard to the trans-impedance amplifier circuitry 230. In one example, providing the trans-impedance amplifier circuitry including coupling the trans-impedance amplifier circuitry to the output of the source follower circuitry. At 430 of the method 400, tracking circuitry that receives the third signal from the trans-impedance amplifier circuitry and an output signal of the voltage regulator circuitry, and tracks a load current (e.g., the load current Iload) of the output signal using the third signal is provided. In one example, the tracking circuitry is one of the tracking circuitry 140 of FIG. 1 or the tracking circuitry 240 of FIG. 2. In one example, providing the tracking circuitry includes coupling the tracking circuitry to an output of the trans-impedance amplifier circuitry. In one example, the method 400 further includes providing an output transistor (e.g., the output transistor 160 of FIG. 1 or the output transistor $M_1$ of FIG. 2). In one example the method 400 is performed a semiconductor manufacturing process to provide voltage regulator circuitry and/or power supply circuitry.

Figure 5:
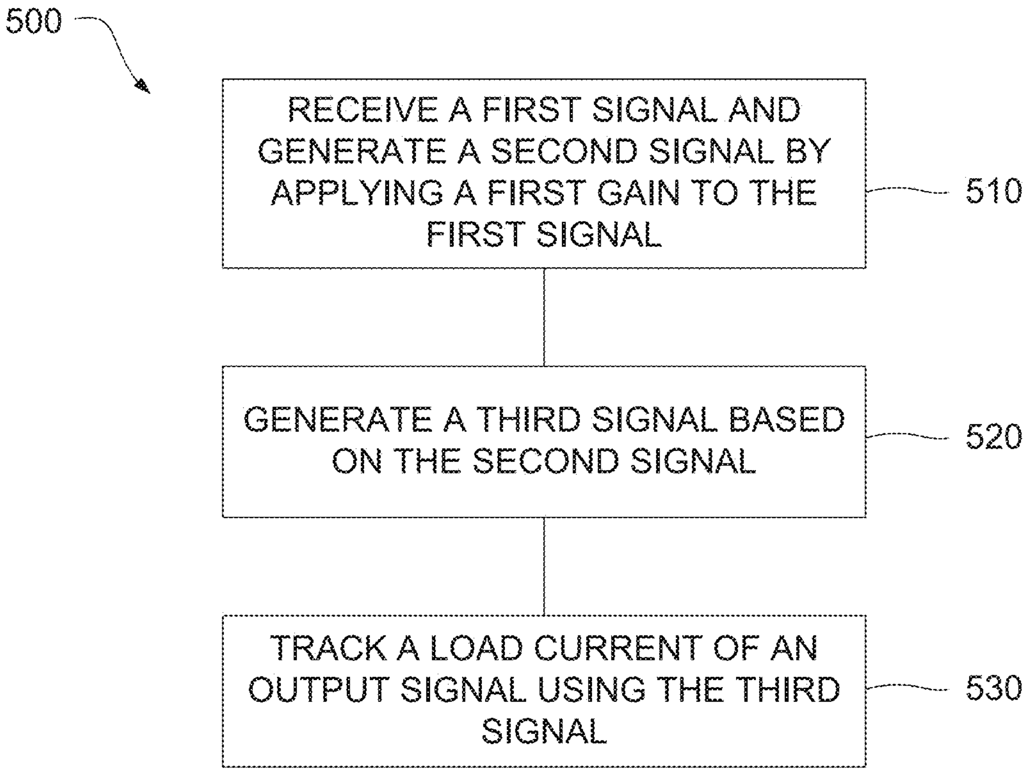
FIG. 5 illustrates a flowchart of a method of operating voltage regulator circuitry.

FIG. 5 illustrates a flowchart of a method 500 for operating voltage regulator circuitry having an increased regulator bandwidth and a stable output DC voltage signal over a wide range of load currents. The method 500 is performed by the voltage regulator circuitry 100 of FIG. 1 and/or the voltage regulator circuitry 200 of FIG. 2.

At 510 of the method 500, a first signal is received and a second signal is generated by applying a first gain to the first signal. For example with reference to FIG. 1, the input circuitry 110 outputs the signal 112 based on the voltage signal 102. The source follower circuitry 120 receives the signal 112 from the input circuitry 110. The source follower circuitry 120 generates the signal 122 by applying a gain to the signal 112. With reference to FIG. 2, the input circuitry 210 outputs the signal 211 based on the voltage signal Vref. The source follower circuitry 220 receives the signal 211 from the input circuitry 210. The source follower circuitry 220 generates the signal 221 by applying a gain to the signal 211.

At 520 of the method 500, a third signal is generated based on the second signal. For example with reference to FIG. 1, the trans-impedance amplifier circuitry 130 generates the signal 132 from the signal 122. With reference to FIG. 2, the trans-impedance amplifier circuitry 230 generates the signal 231 from the signal 221.

At 530, a load current of an output signal is tracked using the third signal. For example with reference to FIG. 1, the tracking circuitry 140 tracks a load current of the output load using the signal 132 and the output signal of the output transistor. With reference to FIG. 2, the tracking circuitry 240 tracks the load current Iload using the signal 231 and the signal at the node Vreg.

While the foregoing is directed to specific examples, other and further examples may be devised without departing from the basic scope thereof, and the scope thereof is determined by the claims that follow.

What is claimed is:

1. A voltage regulator circuitry comprising:

source follower circuitry configured to receive a first signal and generate a second signal by applying a first gain to the first signal;

trans-impedance amplifier circuitry configured to receive the second signal from the source follower circuitry and output a third signal based on the second signal; and tracking circuitry configured to receive the third signal from the trans-impedance amplifier circuitry and an output signal of the voltage regulator circuitry, and track a load current of the output signal using the third signal.

2. The voltage regulator circuitry of claim 1, wherein the trans-impedance amplifier circuitry is configured to increase a pole frequency of the second signal based on a gain of the trans-impedance amplifier circuitry.

3. The voltage regulator circuitry of claim 2 further comprising:

an output transistor configured to receive the third signal from the trans-impedance amplifier circuitry and output the output signal based on the third signal, wherein a pole frequency of the third signal is increased based on a low output resistance of the trans-impedance amplifier circuitry.

4. The voltage regulator circuitry of claim 3, wherein the tracking circuitry comprises a first transistor that is a scaled version of the output transistor.

5. The voltage regulator circuitry of claim 4, wherein the tracking circuitry comprises a second transistor and a compensation capacitance, wherein a resistance value of the second transistor is a linear function of the load current, and the second transistor is in series with the compensation capacitance.

6. The voltage regulator circuitry of claim 5, wherein the second transistor is configured to add a zero in a regulator feedback loop that cancels a non-dominant pole on an output node.

7. The voltage regulator circuitry of claim 6, wherein, based on a decrease in the load current, the resistance value of the second transistor is increased, and, based on an increase in the load current, the resistance value of the second transistor is decreased.

8. The voltage regulator circuitry of claim 1, wherein the source follower circuitry comprises an n-channel metal-oxide semiconductor (NMOS) transistor coupled to an output of the source follower circuitry.

9. A integrated circuit (IC) system comprising:

an IC device; and voltage regulator circuitry coupled to the IC device and configured to output an output signal to the IC device, the voltage regulator circuitry comprising:

source follower circuitry configured to receive a first signal and generate a second signal by applying a first gain to the first signal;

trans-impedance amplifier circuitry configured to receive the second signal from the source follower circuitry and output a third signal based on the second signal; and tracking circuitry configured to receive the third signal from the trans-impedance amplifier circuitry and the output signal, and track a load current of the output signal using the third signal.

10. The IC system of claim 9, wherein the trans-impedance amplifier circuitry is configured to increase a pole frequency of the second signal based on a gain of the trans-impedance amplifier circuitry.

11. The IC system of claim 10, wherein the voltage regulator circuitry further comprises:

an output transistor configured to receive the third signal from the trans-impedance amplifier circuitry and output the output signal based on the third signal, wherein a pole frequency of the third signal is increased based on a low output resistance of the trans-impedance amplifier circuitry.

12. The IC system of claim 11, wherein the tracking circuitry comprises a first transistor that is a scaled version of the output transistor.

13. The IC system of claim 12, wherein the tracking circuitry comprises a second transistor and a compensation capacitance, wherein a resistance value of the second transistor is a linear function of the load current, and the second transistor is in series with the compensation capacitance.

14. The IC system of claim 13, wherein the second transistor is configured to add a zero in a regulator feedback loop of the voltage regulator circuitry to cancel a first non-dominant pole at the output signal.

15. The IC system of claim 14, wherein, based on a decrease in the load current, the resistance value of the second transistor is increased, and, based on an increase in the load current, the resistance value of the second transistor is decreased.

16. The IC system of claim 9, wherein the source follower circuitry comprises an n-channel metal-oxide semiconductor (NMOS) transistor coupled to an output of the source follower circuitry.

17. A method comprising:

receiving, via source follower circuitry of voltage regulator circuitry, a first signal and generating a second signal by applying a first gain to the first signal;

generating, via trans-impedance amplifier circuitry of the voltage regulator circuitry, a third signal based on the second signal; and tracking, via tracking circuitry of the voltage regulator circuitry, a load current of an output signal of the voltage regulator circuitry using the third signal.

18. The method of claim 17 further comprising increasing, via the trans-impedance amplifier circuitry, a pole frequency of the second signal based on a gain of the trans-impedance amplifier circuitry.

19. The method of claim 17, wherein the voltage regulator circuitry comprises an output transistor configured to receive the third signal from the trans-impedance amplifier circuitry and output the output signal based on the third signal, wherein a pole frequency of the third signal is increased based on a low output resistance of the trans-impedance amplifier circuitry, and wherein the tracking circuitry comprises a first transistor that is a scaled version of the output transistor.

20. The method of claim 19, wherein the tracking circuitry comprises a second transistor and a compensation capacitance, wherein a resistance value of the second transistor is a linear function of the load current, and the second transistor is in series with the compensation capacitance, and wherein the second transistor is configured to add a zero in a regulator feedback loop that cancels a non-dominant pole on an output node.

* * * * *